United States Patent
Zhang et al.

(10) Patent No.: US 12,219,714 B2
(45) Date of Patent: Feb. 4, 2025

(54) TERMINAL DEVICE

(71) Applicant: Honor Device Co., Ltd., Shenzhen (CN)

(72) Inventors: Yihe Zhang, Shenzhen (CN); Jiuliang Gao, Shenzhen (CN); Zhandong Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/756,606

(22) PCT Filed: Jan. 18, 2022

(86) PCT No.: PCT/CN2022/072605
§ 371 (c)(1),
(2) Date: May 27, 2022

(87) PCT Pub. No.: WO2023/273314
PCT Pub. Date: Jan. 5, 2023

(65) Prior Publication Data
US 2024/0172367 A1    May 23, 2024

(30) Foreign Application Priority Data
Jun. 30, 2021   (CN) .......................... 202121471478.4

(51) Int. Cl.
*H05K 1/18* (2006.01)
*H05K 3/34* (2006.01)

(52) U.S. Cl.
CPC .......... *H05K 1/183* (2013.01); *H05K 3/3452* (2013.01); *H05K 2201/10121* (2013.01)

(58) Field of Classification Search
CPC ................ H05K 1/183; H05K 3/3452; H05K 2201/10121
See application file for complete search history.

(56) References Cited

U.S. PATENT DOCUMENTS

| | | |
|---|---|---|
| 8,085,547 B2 | 12/2011 | Wu et al. |
| 10,349,533 B1 | 7/2019 | Liu et al. |
| 10,991,647 B2 | 4/2021 | Oh et al. |
| 11,439,008 B2 | 9/2022 | Fang et al. |
| 2009/0046432 A1 | 2/2009 | Hsu et al. |
| 2010/0225001 A1 | 9/2010 | Hizume |
| 2010/0327435 A1 | 12/2010 | Nakamura et al. |
| 2013/0088841 A1 | 4/2013 | Ohshima et al. |

(Continued)

FOREIGN PATENT DOCUMENTS

| | | |
|---|---|---|
| CN | 101296566 A | 10/2008 |
| CN | 103379749 A | 10/2013 |

(Continued)

*Primary Examiner* — Hoa C Nguyen
(74) *Attorney, Agent, or Firm* — Slater Matsil, LLP

(57) ABSTRACT

A terminal device comprises a component and a circuit board. The circuit board comprises a circuit substrate and a solder mask layer, and wherein the circuit substrate comprises a medium layer and a circuit layer stacked with the medium layer. Openings with different depths are provided in the circuit board, and at least part of the component is accommodated in or arranged corresponding to the opening. This lowers an installation height between the component and the circuit board without affecting their performance.

20 Claims, 8 Drawing Sheets

(56) References Cited

U.S. PATENT DOCUMENTS

| | | | |
|---|---|---|---|
| 2014/0090877 A1* | 4/2014 | Takagi | H01L 23/49827 |
| | | | 174/255 |
| 2015/0115426 A1 | 4/2015 | Lee et al. | |
| 2015/0255411 A1* | 9/2015 | Karhade | H01L 24/81 |
| | | | 361/679.55 |
| 2016/0073515 A1* | 3/2016 | Shimizu | H05K 1/185 |
| | | | 361/761 |
| 2016/0143139 A1 | 5/2016 | Sorimachi et al. | |
| 2017/0019989 A1 | 1/2017 | Lee | |

FOREIGN PATENT DOCUMENTS

| | | |
|---|---|---|
| CN | 103458628 A | 12/2013 |
| CN | 204392684 U | 6/2015 |
| CN | 105764234 A | 7/2016 |
| CN | 110972414 A | 4/2020 |
| CN | 111182709 A | 5/2020 |
| JP | H10335776 A | 12/1998 |
| JP | 2016096224 A | 5/2016 |
| JP | 2017130697 A | 7/2017 |
| TW | 201628175 A | 8/2016 |
| WO | 2022035498 A1 | 2/2022 |

* cited by examiner

TERMINAL DEVICE

CROSS-REFERENCE TO RELATED APPLICATIONS

This application is a National Stage of International Application No. PCT/CN2022/072605, filed on Jan. 18, 2022, which claims priority to Chinese Patent Application No. 202121471478.4, filed on Jun. 30, 2021. The disclosures of which are incorporated herein by reference in their entireties.

TECHNICAL FIELD

This application relates to the field of terminal technologies, and in particular, to a terminal device.

BACKGROUND

Currently, small volume and high performance are key indicators pursued by users with respect to terminal devices. However, volume sizes of some components have great influence on their performance such that small volume and high performance of terminal devices may somewhat conflict with each other.

SUMMARY

In view of this, it is necessary to provide a terminal device which has a smaller installation height without compromising performance.

A terminal device, including a component and a circuit board, where the circuit board includes a circuit substrate and a solder mask layer, and the solder mask layer is located on a surface of the circuit substrate; the circuit board includes a first opening, the first opening is recessed on a surface of the solder mask layer away from the circuit substrate, and at least part of the component is accommodated in the first opening.

In the foregoing design, at least part of the component is accommodated in the first opening, so as to lower an installation height between the component and the circuit board without affecting their performance. In addition, the first opening does not penetrate the solder mask layer, so it is unnecessary to consider whether a surface of the component in direct contact with the solder mask layer is conductive and whether electrical connection between the component and the circuit substrate may cause short circuit of the circuit board, signal loss, or other results. This allows the component to be applied to more scenarios. In addition, the solder mask layer can maintain the original function.

In a possible design, the part of the component accommodated in the first opening is in contact with the solder mask layer.

In the foregoing design, the installation height between the component and the circuit board can be minimized.

In a possible design, the part of the component accommodated in the first opening is spaced apart from the solder mask layer.

While lowering the installation height between the component and the circuit board, the foregoing design can prevent the component from coming into rigid contact with the circuit board under the effect of external force to affect performance of the component.

In a possible design, the terminal device further includes a connecting member, and the connecting member is connected to a surface of the component that is not adjoining the circuit board.

In the foregoing design, the component is spaced apart from the circuit board, preventing the component from coming into rigid contact with the circuit board under the effect of external force to affect performance of the component.

In a possible design, the component is one of a lens module, a SIM card tray, a screw washer, and a nut.

The foregoing design may be applied to a plurality of scenarios in which the installation height needs to be lowered.

In a possible design, the component includes a body and a protrusion connected to the body, the protrusion is accommodated in the first opening, and the body is located outside the first opening.

In the foregoing design, the protrusion is accommodated in the first opening, to lower the installation height between the component and the circuit board, preventing the protrusion from increasing the installation height.

In a possible design, the component includes a body and a protrusion connected to the body; the first opening includes a first sub-opening and a second sub-opening, and the first sub-opening is in communication with the second sub-opening; and the protrusion is accommodated in the first sub-opening, and at least part of the body is accommodated in the second sub-opening.

In the foregoing design, a structure of the first opening can be designed based on an outline of the component, thereby further lowering the installation height between the component and the circuit board.

In a possible design, the component is a lens module, the protrusion includes a sub-component, and the sub-component is at least one of a sensor, a lens module, a voice coil actuator, and a hall device.

A terminal device, where the terminal device includes a component and a circuit board; the circuit board includes a circuit substrate and a solder mask layer; the circuit substrate includes a medium layer and a circuit layer stacked with the medium layer, and the solder mask layer is located on a surface of the circuit substrate; and the circuit board includes a second opening, the second opening penetrates the solder mask layer without going into the circuit substrate, and at least part of the component is accommodated in the second opening.

In the foregoing design, the second opening penetrates the solder mask layer, which can further increase a depth of the component accommodated in the circuit board, thereby further lowering an installation height between the component and the circuit board.

In a possible design, the part of the component accommodated in the second opening is in contact with the circuit substrate.

In the foregoing design, the installation height between the component and the circuit board can be minimized.

In a possible design, the part of the component accommodated in the second opening is spaced apart from the circuit substrate.

While lowering the installation height between the component and the circuit board, the foregoing design can prevent the component from coming into rigid contact with the circuit board under the effect of external force to affect performance of the component.

In a possible design, the terminal device further includes a connecting member, and the connecting member is connected to a surface of the component that is not adjoining the circuit board.

In the foregoing design, the component is spaced apart from the circuit board, preventing the component from coming into rigid contact with the circuit board under the effect of external force to affect performance of the component.

In a possible design, the component is one of a lens module, a SIM card tray, a screw washer, and a nut.

The foregoing design may be applied to a plurality of scenarios in which the installation height needs to be lowered.

In a possible design, the component includes a body and a protrusion connected to the body, the protrusion is accommodated in the second opening, and the body is located outside the second opening.

In the foregoing design, the protrusion is accommodated in the second opening, to lower the installation height between the component and the circuit board, preventing the protrusion from increasing the installation height.

In a possible design, the component includes a body and a protrusion connected to the body, the second opening includes a first sub-opening and a second sub-opening, and the first sub-opening is in communication with the second sub-opening; and the protrusion is accommodated in the first sub-opening, and at least part of the body is accommodated in the second sub-opening.

In the foregoing design, a structure of the second opening can be designed based on an outline of the component, thereby further lowering the installation height between the component and the circuit board.

In a possible design, the component is a lens module, the protrusion includes a sub-component, and the sub-component is at least one of a sensor, a lens module, a voice coil actuator, and a hall device.

A terminal device, where the terminal device includes a component and a circuit board, the circuit board includes a circuit substrate and a solder mask layer, and the circuit substrate includes a medium layer and a circuit layer stacked with the medium layer, where there are more than two circuit layers, and the solder mask layer is located on a surface of the circuit substrate; and the circuit board includes a third opening, the third opening penetrates the solder mask layer and the circuit substrate, the circuit board has at least one circuit layer in a projection region of the third opening, and at least part of the component is accommodated in the third opening.

In the foregoing design, the third opening penetrates the solder mask layer and part of the circuit layers, which can further increase a depth of the component accommodated in the circuit board, thereby further lowering an installation height between the component and the circuit board. In addition, the third opening does not penetrate all the circuit layers, which does not affect wiring of the circuit layer on a side of the circuit board away from the component, thereby causing no impact on positions of other components that need to be electrically connected on the circuit layer on the side of the circuit board away from the component.

In a possible design, the medium layer is exposed to the third opening, and the part of the component accommodated in the third opening is in contact with the medium layer.

In the foregoing design, the installation height between the component and the circuit board can be minimized.

In a possible design, the medium layer is exposed to the third opening, and the part of the component accommodated in the third opening is spaced apart from the medium layer.

While lowering the installation height between the component and the circuit board, the foregoing design can prevent the component from coming into rigid contact with the circuit board under the effect of external force to affect performance of the component.

In a possible design, the circuit layer is exposed to the third opening, and the part of the component accommodated in the third opening is in contact with the circuit layer.

In the foregoing design, the installation height between the component and the circuit board can be minimized.

In a possible design, the circuit layer is exposed to the third opening, and the part of the component accommodated in the third opening is spaced apart from the circuit layer.

While lowering the installation height between the component and the circuit board, the foregoing design can prevent the component from coming into rigid contact with the circuit board under the effect of external force to affect performance of the component.

In a possible design, the terminal device further includes a connecting member, and the connecting member is connected to a surface of the component that is not adjoining the circuit board.

In the foregoing design, the component is spaced apart from the circuit board, preventing the component from coming into rigid contact with the circuit board under the effect of external force to affect performance of the component.

In a possible design, the component is one of a lens module, a SIM card tray, a screw washer, and a nut.

The foregoing design may be applied to a plurality of scenarios in which the installation height needs to be lowered.

In a possible design, the component includes a body and a protrusion connected to the body, the protrusion is accommodated in the third opening, and the body is located outside the third opening.

In the foregoing design, the protrusion is accommodated in the third opening, to lower the installation height between the component and the circuit board, preventing the protrusion from increasing the installation height.

In a possible design, the component includes a body and a protrusion connected to the body, the third opening includes a first sub-opening and a second sub-opening, and the first sub-opening is in communication with the second sub-opening; and the protrusion is accommodated in the first sub-opening, and at least part of the body is accommodated in the second sub-opening.

In the foregoing design, a structure of the third opening can be designed based on an outline of the component, thereby further lowering the installation height between the component and the circuit board.

In a possible design, the component is a lens module, the protrusion includes a sub-component, and the sub-component is at least one of a sensor, a lens module, a voice coil actuator, and a hall device.

A terminal device, including a component and a circuit board, where the circuit board includes a fourth opening, the fourth opening is recessed inward on a surface of the circuit board facing the component, and at least part of the component is arranged corresponding to the fourth opening.

The foregoing design makes up for a to-be-reserved safe distance between the component and the circuit board, thereby lowering an installation height between the component and the circuit board.

In a possible design, the component includes a sub-component in a region corresponding to the fourth opening, and the sub-component is a hall device.

In the foregoing design, because the hall device is a component sensitive to external force, a safe distance needs to be reserved between the component and the circuit board. Arranging the fourth opening can make up for at least part of the safe distance, thereby lowering the installation height between the component and the circuit board.

In a possible design, the circuit board includes a circuit substrate and a solder mask layer located on a surface of the circuit substrate, and the fourth opening is recessed on a surface of the solder mask layer away from the circuit substrate.

The foregoing design makes up for a to-be-reserved safe distance between the component and the circuit board, thereby lowering the installation height between the component and the circuit board.

In a possible design, the circuit board includes a circuit substrate and a solder mask layer located on a surface of the circuit substrate, and the fourth opening penetrates the solder mask layer without going into the circuit substrate.

The foregoing design further makes up for a to-be-reserved safe distance between the component and the circuit board, thereby lowering the installation height between the component and the circuit board.

In a possible design, the circuit board includes a circuit substrate and a solder mask layer located on a surface of the circuit substrate, and the circuit substrate includes a medium layer and a circuit layer stacked with the medium layer, where there are more than two circuit layers; and the fourth opening penetrates the solder mask layer and part of the circuit substrate; and the circuit board has at least one circuit layer in a projection region of the fourth opening.

The foregoing design further makes up for a to-be-reserved safe distance between the component and the circuit board, thereby lowering the installation height between the component and the circuit board.

REFERENCE SIGNS OF MAIN COMPONENTS

Figure 1:
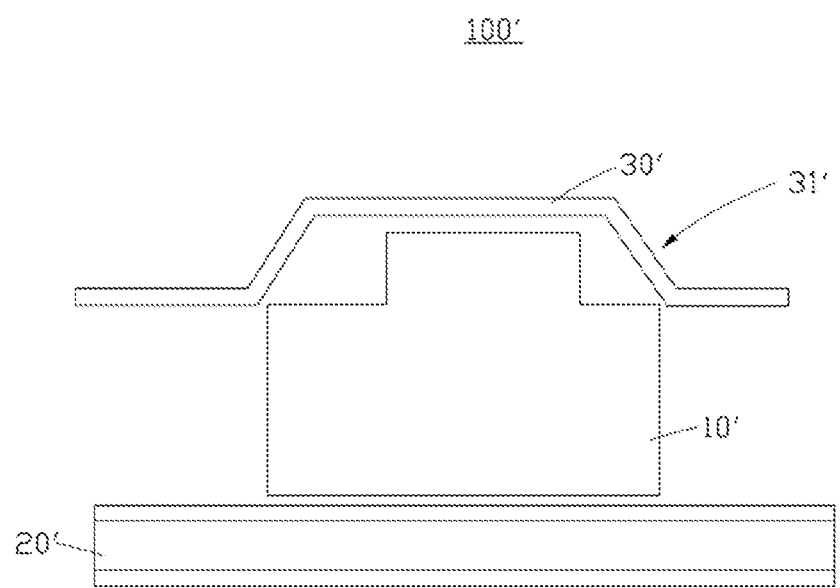
FIG. 1 is a schematic diagram of partial structure of a terminal device according to an embodiment of this application.

| | |
|---|---|
| Terminal device | 100, 100a, 100b, 100c, 100' |
| Component | 10, 10' |
| Body | 11 |
| Protrusion | 13 |

-continued

| | |
|---|---|
| Sub-component | 131, 131a |
| Circuit board | 20, 20' |
| Circuit substrate | 21 |
| Medium layer | 212 |
| Circuit layer | 214 |
| Solder mask layer | 23 |
| Connecting member | 25 |
| Decorative part | 30, 30' |
| Convex portion | 31' |
| First opening | 40 |
| First sub-opening | 41, 41a |
| Second sub-opening | 43, 43a |
| Second opening | 50 |
| Third opening | 60 |
| Fourth opening | 70 |
| Width | W1, W2 |

This application will be further described with reference to the accompanying drawings in the following specific embodiments.

DETAILED DESCRIPTION OF ILLUSTRATIVE EMBODIMENTS

To more clearly understand the foregoing purposes, features, and advantages in this application, the following describes in detail this application with reference to the accompanying drawings and specific embodiments. It should be noted that, in absence of conflicts, the embodiments and features in the embodiments in this application may be mutually combined. The following illustrates many specific details for full understanding of this application, and the described embodiments are only some rather than all of the embodiments of this application.

Unless otherwise defined, all technical and scientific terms used herein shall have the same meanings as commonly understood by those skilled in the art to which this application belongs. The terms used herein in the specification of this application are merely intended to describe specific embodiments but not intended to limit this application. The term "and/or" used herein includes any and all combinations of one or more related listed items.

In the embodiments of this application, for description instead of limitation on this application, the term "connection" used in the specification and claims of this application is not limited to physical or mechanical connection, whether directly or indirectly. "Upper", "lower", "above", "below", "left", and "right" are merely used to indicate relative location relationship. The relative location relationship should correspondingly change according to the change of an absolute location of the described object.

Some embodiments of this application provide a terminal device, where the terminal device includes a component and a circuit board. The circuit board includes a circuit substrate and a solder mask layer, and the circuit substrate includes a medium layer and a circuit layer stacked with the medium layer. According to actual demands, openings with different depths are provided in the circuit board, and at least part of the component is accommodated in or arranged corresponding to the opening.

In the foregoing design, an installation height between the component and the circuit board is lowered without affecting their performance.

The installation height in this application is a height after the component and the circuit board are installed along their stack direction. In some embodiments, the installation height includes a distance between the component and the circuit board.

The following describes in detail some embodiments of this application with reference to the accompanying drawings. In absence of conflicts, the following embodiments and features in the embodiments may be mutually combined.

Referring to FIG. 1, an embodiment of this application provides a terminal device 100', such as a mobile phone and a tablet computer. The terminal device 100' such as a mobile phone and a tablet computer tends to be smaller. The inventor of this application has found that, in the terminal device 100' such as a mobile phone and a tablet computer, a circuit board 20', a component 10' (such as a lens module) provided on a surface of the circuit board 20', and a decorative part 30' covering the component 10' are important factors for affecting an installation height of the terminal device 100' such as a mobile phone and a tablet computer. Because of a large volume of the lens module, a convex portion 31' is designed on the decorative part 30' of the actual terminal device 100'. For aesthetics of the terminal device 100', a size of the convex portion 31' is made as small as possible, which conflicts with performance demands of the lens module.

Embodiment 1

Figure 2:
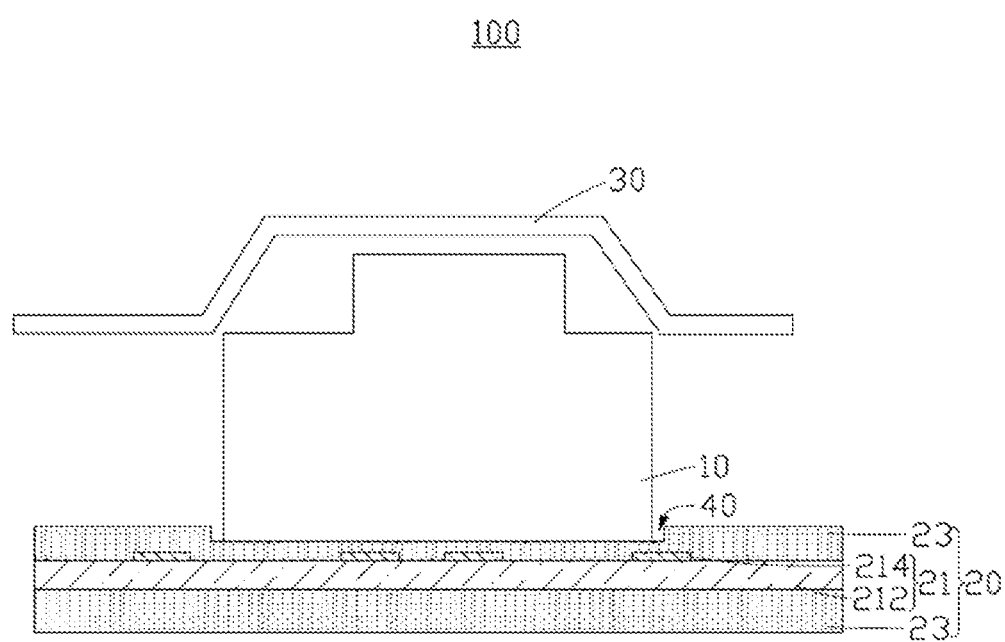
FIG. 2 is a schematic diagram of partial structure of a terminal device which has a first opening on a circuit board according to Embodiment 1 of this application.
Figure 3:
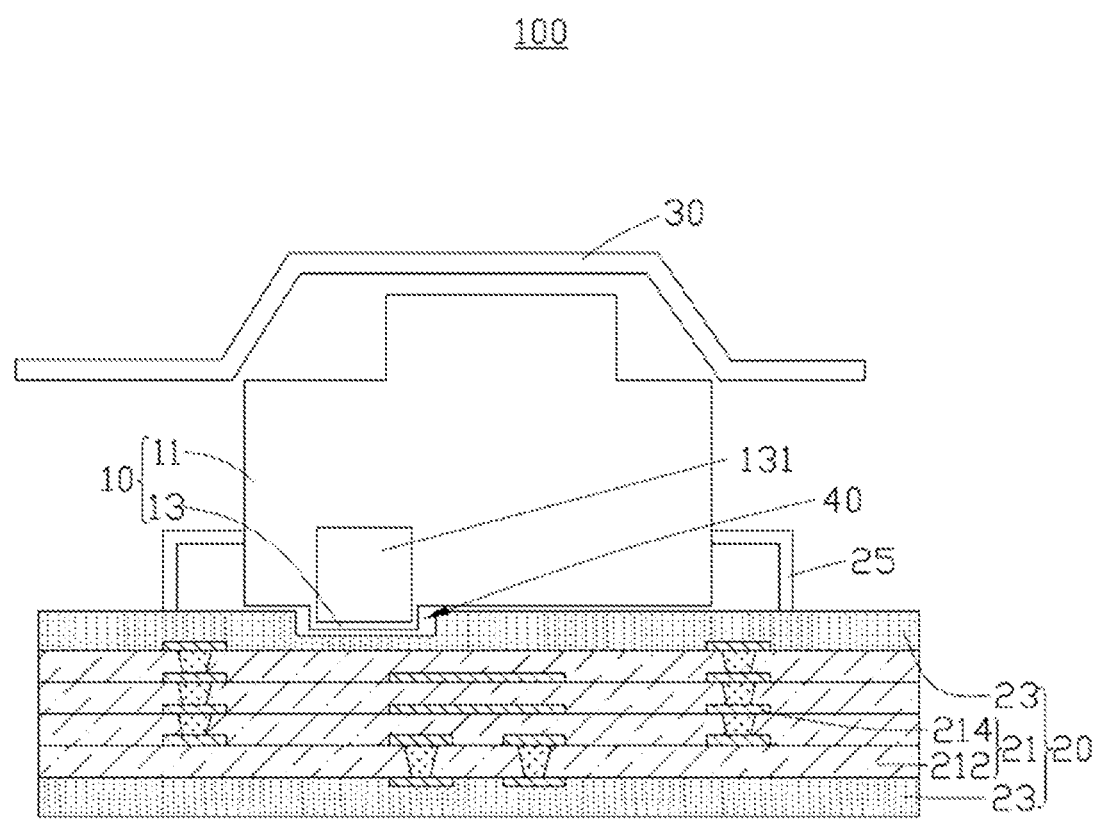
FIG. 3 is a schematic diagram of partial structure of a terminal device which has a protrusion on a component according to Embodiment 1 of this application.
Figure 4:
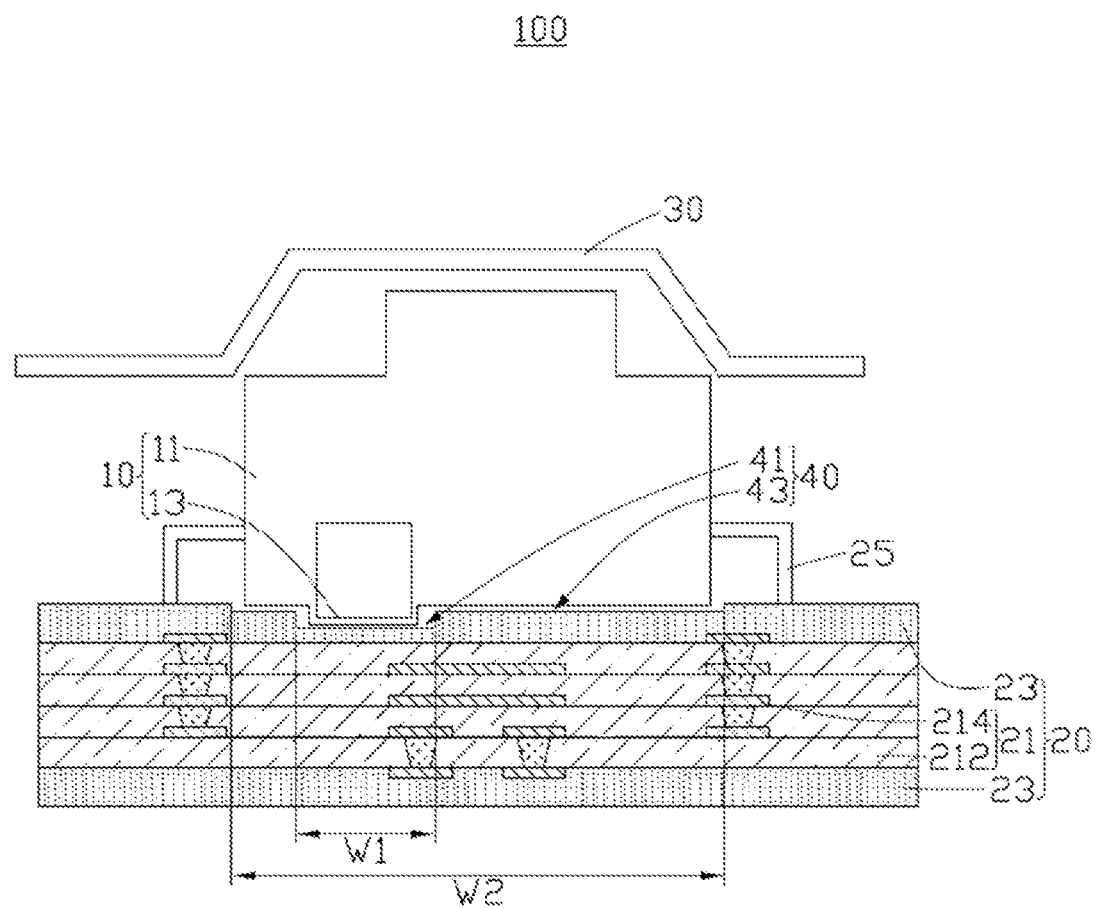
FIG. 4 is a schematic diagram of partial structure of a terminal device which has a step-like first opening according to Embodiment 1 of this application.

Referring to FIG. 2 to FIG. 4, an embodiment of this application provides a terminal device 100. The terminal device 100 includes a component 10 and a circuit board 20, and at least part of the component 10 is embedded in the circuit board 20. The terminal device 100 is a product that has at least the circuit board 20 and the component 10, where the component 10 is provided on the circuit board 20. The terminal device 100 includes but is not limited to a mobile phone, a tablet computer, a camera, a video camera, a monitor, and the like.

The component 10 may be a component 10 electrically connected to the circuit board 20, for example, a lens module or a SIM (Subscriber Identity Module, subscriber identity module) card tray, or may be a component 10 insulatedly connected to the circuit board 20, for example, a screw washer or a nut (such as a surface-mount nut). The component 10 is insulated from a surface adjoining the circuit board 20. It should be noted that when the component 10 is a component 10 electrically connected to the circuit board 20, the component 10 may be in contact with the circuit board 20, and the component 10 may be electrically connected to the component 10 through a wire (not shown in the figure) provided in another region of the circuit board 20.

The following description assumes that the terminal device 100 is a mobile phone and the component 10 is a lens module. The terminal device 100 includes the component 10 and the circuit board 20, and the terminal device 100 may further include a decorative part 30. At least part of the component 10 is accommodated in the circuit board 20, and the decorative part 30 is located on a side of the component 10 away from the circuit board 20 and covers the component 10. It can be understood that, in absence of conflicts, the following features may be applied to other terminal devices 100 and other components.

The circuit board 20 may be one of a flex board, a rigid board, or a rigid-flex board.

Still referring to FIG. 2 to FIG. 4, the circuit board 20 includes a circuit substrate 21 and a solder mask layer 23 located on a surface of the circuit substrate 21. The circuit substrate 21 includes a medium layer 212 and a circuit layer 214 stacked with the medium layer 212, and at least one surface of the circuit layer 214 is exposed to the medium layer 212. The solder mask layer 23 covers the medium layer 212, and also covers the circuit layer 214 exposed to the medium layer 212. The solder mask layer 23 provides insulation and enhances aesthetics, and can also prevent the circuit layer 214 from being short-circuited, oxidized, and corroded.

The circuit substrate 21 may be a single-layer circuit substrate (referring to FIG. 2), or may be a multi-layer circuit substrate (referring to FIG. 3 and FIG. 4). The single-layer circuit substrate has one circuit layer 214; and the multi-layer circuit substrate has two or more than two circuit layers 214, where the plurality of circuit layers 214 are spaced apart through the medium layer 212 and are electrically connected to each other.

In this embodiment, a first opening 40 is provided in the solder mask layer 23, the first opening 40 is provided in a surface of the solder mask layer 23 away from the circuit substrate 21 and is recessed toward the circuit substrate 21, and the first opening 40 does not penetrate the solder mask layer 23. The solder mask layer 23 may be recessed by machining, so as to form the first opening 40; or no circuit layer 214 is provided in a region in which the first opening 40 is located, and during a process of forming the solder mask layer 23, a thickness of the region of the solder mask layer 23 in which no circuit layer 214 is provided is less than a thickness of a surrounding region of the solder mask layer 23 or a total thickness of the solder mask layer 23 and the circuit layer 214, so that the partial region of the solder mask layer 23 is recessed to form the first opening 40. The first opening 40 may be provided in a region of an outer surface of the circuit board 20 without a welding pad (not shown in the figure) for electrical connection, to avoid affecting electrical connection between the circuit board 20 and other components.

At least part of the component 10 may be provided in the first opening 40. To be specific, in some embodiments, part of the component 10 is accommodated in the first opening 40, and the other part protrudes from the circuit board 20; in some other embodiments, the component 10 is wholly accommodated in the first opening 40. At least part of the component 10 is accommodated in the first opening 40, which can effectively lower an installation height between the component 10 and the circuit board 20 without affecting performance of the component 10 and the circuit board 20. In addition, a convex portion of a decorative part 30 of the terminal device 100 is also actually lowered, enhancing overall aesthetics of the terminal device 100.

The lowered installation height is related to a depth of the component 10 accommodated in the first opening 40. In some embodiments, the lowered installation height ranges from 0.04 mm to 0.05 mm.

In this embodiment, when the first opening 40 does not penetrate the solder mask layer 23, because of the insulation function of the solder mask layer 23, the component 10 accommodated in the first opening 40 is spaced apart from the circuit substrate 21 through the solder mask layer 23, and is not electrically connected to the circuit substrate 21 directly. Therefore, in this embodiment, it is unnecessary to consider whether a surface of the component 10 that is in direct contact with the solder mask layer 23 is conductive and whether electrical connection between the component 10 and the circuit substrate 21 may cause short circuit of the circuit board 20, signal loss, or other results. In other words, this embodiment allows the component 10 to be applied to more scenarios. In addition, the first opening 40 does not penetrate the solder mask layer 23, and therefore the solder mask layer 23 with the first opening 40 region still maintains the original function of the solder mask layer 23.

The part of the component 10 accommodated in the first opening 40 may be in contact with the solder mask layer 23 (referring to FIG. 2), or may be spaced apart from the solder mask layer 23 (referring to FIG. 3 and FIG. 4), that is, a distance is reserved between the component 10 and the solder mask layer 23. In some embodiments, when external force (such as impact) has no influence or little influence on performance of the component 10, the component 10 may be in contact with a surface of the solder mask layer 23 of the circuit board 20 along a stack direction of the component 10 and the circuit board 20, to minimize the installation height between the component 10 and the circuit board 20. The surface of the component 10 in contact with the solder mask layer 23 of the circuit board 20 may alternatively be another surface, such as a side surface of the component 10. In some embodiments, when the external force has great influence on the performance of the component 10, the component 10 is spaced apart from the solder mask layer 23 of the circuit board 20, to reserve a safe distance, and prevent rigid contact between the component 10 and the circuit board 20. A connecting member 25 (referring to FIG. 3 and FIG. 4) may be connected to a surface of the component 10 that is not adjoining the circuit board 20 (namely, a surface other than an adjoining surface, such as a side surface of the component 10) to support the component 10 up, so as to prevent direct contact between the component 10 and the circuit board 20. In some embodiments, when the external force has great influence on the performance of the component 10, a surface of the component 10 that is adjoining the circuit board 20 is made of a material with a buffer effect (such as an elastic material, not shown in the figure), in which case the component 10 can be in direct contact with the solder mask layer 23.

The part of the component 10 accommodated in the first opening 40 is spaced apart from the solder mask layer 23, and the component 10 is connected to the circuit board 20 through the connecting member 25 provided on the surface of the component 10 that is not adjoining the circuit board 20, to support the component 10 up. The connecting member 25 has functions of reducing impact, improving positioning accuracy, and the like. The connecting member 25 does not increase the installation height between the component 10 and the circuit board 20. It can be understood that the connecting member 25 includes but is not limited to a support, a gelatiniform, and the like, and the connecting member 25 is not limited to connecting the component 10 and the circuit board 20. For example, in some embodiments, the component 10 may be attached to the decorative part 30 by the gelatiniform.

In some embodiments, the component 10 includes a body 11 and a protrusion 13, the protrusion 13 is connected to the body 11 and protrudes toward the first opening 40, and the protrusion 13 is accommodated in the first opening 40.

Referring to FIG. 3 and FIG. 4, in some embodiments, when the component 10 is a lens module, the protrusion 13 includes a sub-component 131, such as a sensor, a lens module, a voice coil actuator, and a hall device, and the sub-component 131 causes a partial region of the lens module to be thick. The protrusion 13 is accommodated in the first opening 40, and the body 11 is located outside the first opening 40, so as to lower the installation height between the component 10 and the circuit board 20, preventing the protrusion 13 from increasing the installation height.

Referring to FIG. 4, in some embodiments, when the component 10 includes the protrusion 13, the first opening 40 may alternatively be in a step-like shape.

Specifically, the first opening 40 may include a first sub-opening 41 and a second sub-opening 43, and the first sub-opening 41 is in communication with the second sub-opening 43. A depth of the first sub-opening 41 is greater than a depth of the second sub-opening 43 in a direction vertical to a recess direction of the first opening 40, meaning that the first sub-opening 41 is located on a side closer to the circuit substrate 21, and the second sub-opening 43 is located on a side farther away from the circuit substrate 21. A width W1 of the first sub-opening 41 is less than a width W2 of the second sub-opening 43, so that the protrusion 13 is accommodated in the first sub-opening 41, and at least part of the body 11 is accommodated in the second sub-opening 43. A structure of the first opening 40 can be designed based on an outline of the component 10, thereby further lowering the installation height between the component 10 and the circuit board 20.

Embodiment 2

Figure 5:
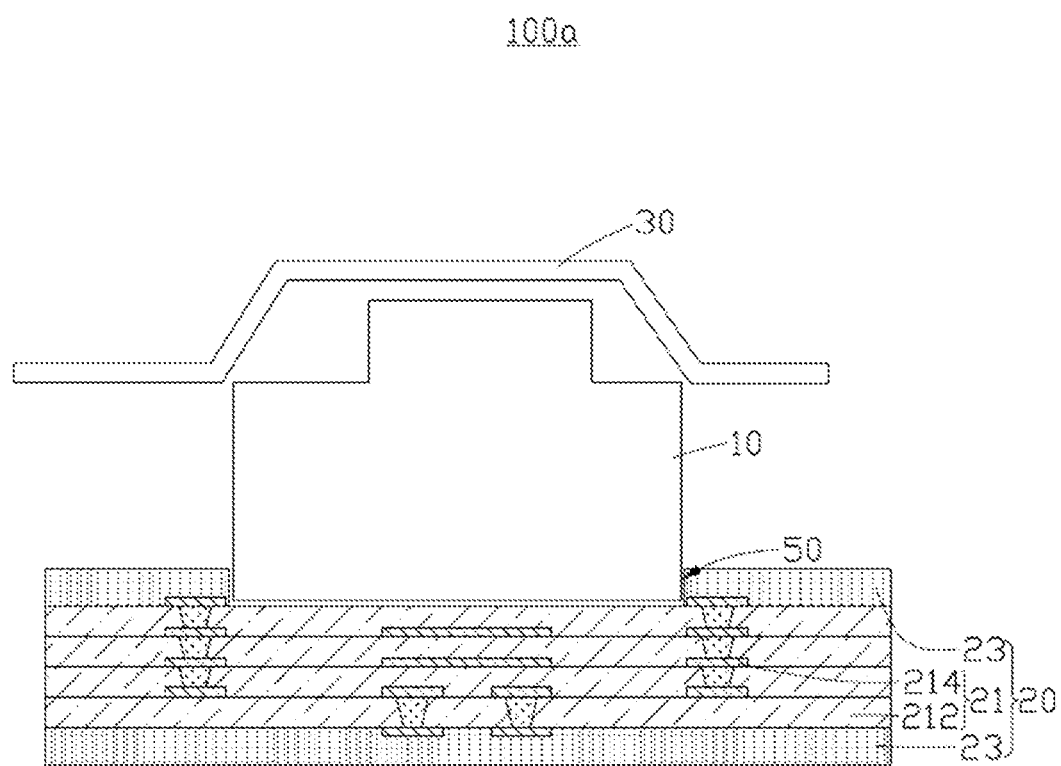
FIG. 5 is a schematic diagram of partial structure of a terminal device which has a second opening on a circuit board according to Embodiment 2 of this application.

Referring to FIG. 5, Embodiment 2 of this application provides a terminal device 100a, including a component 10 and a circuit board 20. Types of the component 10 and the circuit board 20 in Embodiment 2 are roughly the same as those in Embodiment 1. The main differences are: a second opening 50 is provided in the circuit board 20, the second opening 50 penetrates a solder mask layer 23 without going into a circuit substrate 21, that is, the second opening 50 only penetrates the solder mask layer 23, and at least part of the component 10 is accommodated in the second opening 50. The second opening 50 penetrating the solder mask layer 23 can further increase a depth of the component 10 accommodated in the circuit board 20, thereby further lowering an installation height between the component 10 and the circuit board 20.

Because the second opening 50 penetrates the solder mask layer 23, the circuit substrate 21 is exposed to the second opening 50. A surface of the circuit substrate 21 exposed to the second opening 50 may be a medium layer 212, or may be a circuit layer 214. However, to satisfy that the component 10 is insulatedly connected to the circuit layer 214 exposed to the second opening 50, a surface of the component 10 may be made of an insulation material, the component 10 may be spaced apart from the circuit layer 214, or the circuit layer 214 exposed to the second opening 50 may form an "island", that is, the circuit layer 214 is not electrically connected to other circuit layers 214 to implement insulated connection between the component 10 and the circuit layer 214 exposed to the second opening 50. The second opening 50 preferably does not expose the circuit layer 214, to prevent the circuit layer 214 exposed to the second opening 50 from being oxidized or corroded.

The second opening 50 may be formed by machining, or may be formed by providing no solder mask layer 23 on a partial region. Specifically, during a process of machining the circuit board 20, before the solder mask layer 23 is formed on a surface of the circuit substrate 21, ink used for forming the solder mask layer 23 may be coated on other regions other than a mesh for forming the solder mask layer 23 in the partial region for forming the second opening 50, so as to form the second opening 50 on the specified region without adding extra processes or increasing production costs for forming the second opening 50. In other words, the installation height between the component and the circuit board 20 can be lowered with lower costs.

It can be understood that, in this embodiment, the component 10 may also include a body 11 and a protrusion 13, and the installation manner may be the same as that in Embodiment 1. The second opening 50 may also be step-like. Details are not described herein again.

Embodiment 3

Figure 6:
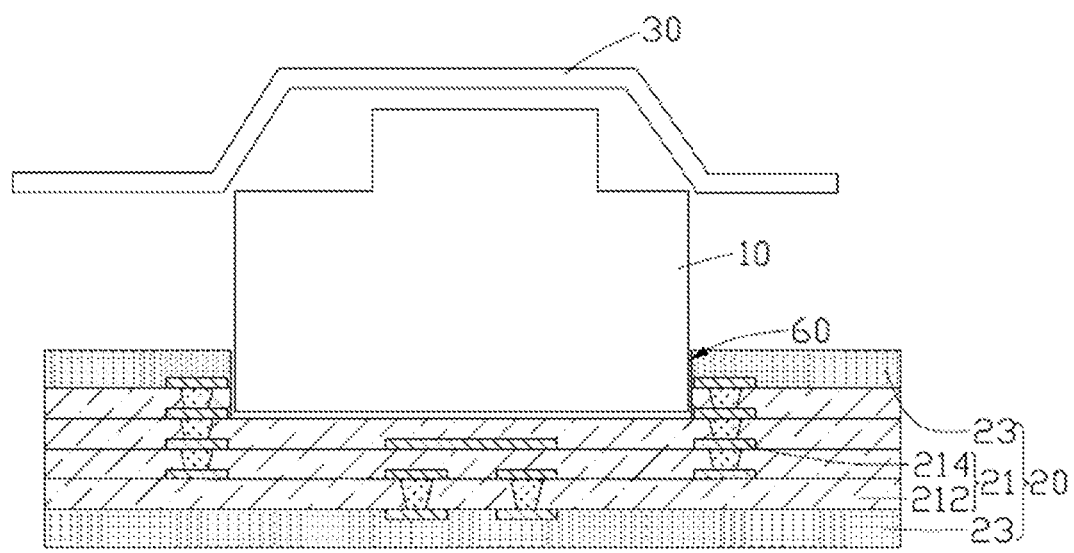
FIG. 6 is a schematic diagram of partial structure of a terminal device which has a third opening on a circuit board according to Embodiment 3 of this application.
Figure 7:
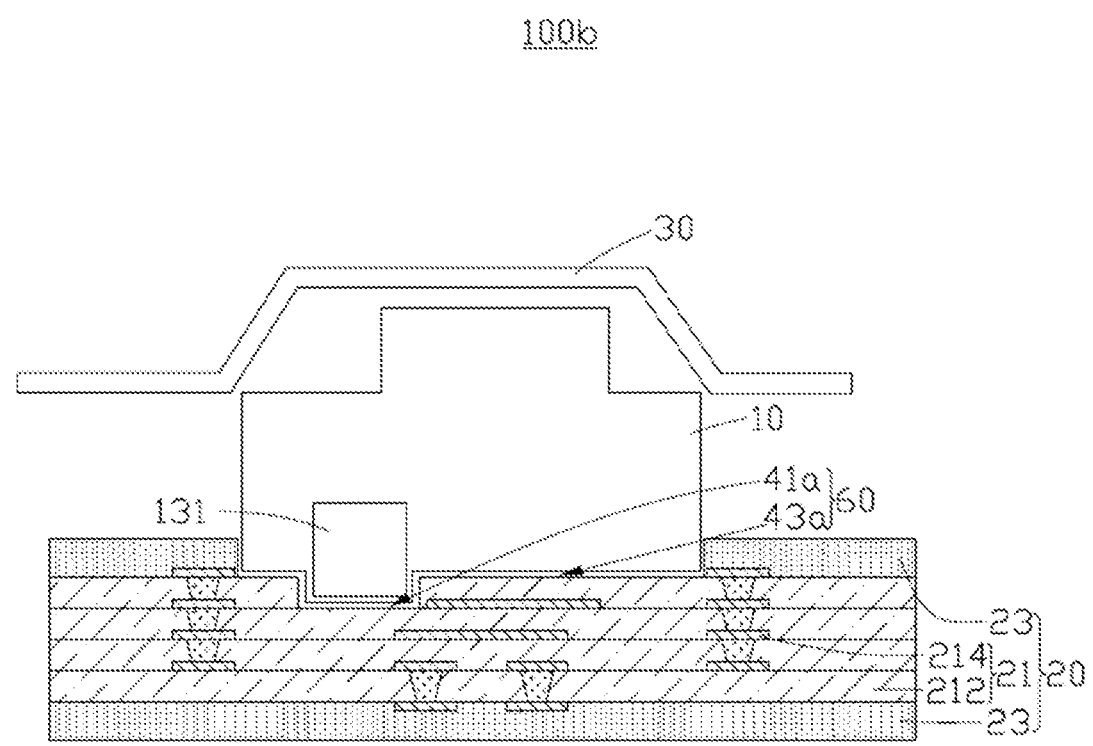
FIG. 7 is a schematic diagram of partial structure of a terminal device which has a step-like third opening according to Embodiment 3 of this application.

Referring to FIG. 6 and FIG. 7, Embodiment 3 of this application provides a terminal device 100b, including a component 10 and a circuit board 20. Types of the component 10 and the circuit board 20 in Embodiment 3 are roughly the same as those in Embodiment 1. The main differences are: a third opening 60 is provided in the circuit board 20, the third opening 60 penetrates a solder mask layer 23 and part of a circuit substrate 21, a surface of a medium layer 212 or a circuit layer 214 is exposed to the third opening 60, and at least part of the component 10 is accommodated in the third opening 60.

In this embodiment, the surface of the medium layer 212 is exposed to the third opening 60. The circuit substrate 21 of the circuit board 20 is a multi-layer circuit substrate. The third opening 60 penetrates the solder mask layer 23 and the circuit layer 214, to expose the medium layer 212. In some embodiments, one medium layer 212 may be penetrated only in part, so that the medium layer 212 is exposed to the third opening 60. The component accommodated in the third opening 60 may be in contact with or spaced apart from a surface of the medium layer 212 exposed to the third opening 60. Because the medium layer 212 is made of an insulating material, the component 10 accommodated in the third opening 60 is the same as that in Embodiment 1, and it is unnecessary to consider whether a surface of the component 10 that is in direct contact with the solder mask layer 23 is conductive and whether electrical connection between the component 10 and the circuit substrate 21 may cause short circuit of the circuit board 20, signal loss, or other results. The third opening 60 preferably does not expose the circuit layer 214, to prevent the circuit layer 214 exposed to the third opening 60 from being oxidized or corroded.

In some embodiments, the surface of the circuit layer 214 is exposed to the third opening 60. The third opening 60 penetrates the solder mask layer 23, part of the circuit layers 214, and part of the medium layers 212, to expose the circuit layers 214. For example, the opening 60 penetrates the solder mask layer, one circuit layer, and one medium layer, to expose the circuit layer. The component accommodated in the third opening 60 may be in contact with or spaced apart from a surface of the circuit layer 214 exposed to the third opening 60. The component 10 accommodated in the third opening 60 may be insulatedly connected to the circuit layer 214 exposed to the third opening 60. A surface of the component 10 may be made of an insulating material, the component 10 may be spaced apart from the circuit layer 214, or the circuit layer 214 exposed to the third opening 60 may form an "island", that is, the circuit layer 214 is not electrically connected to other circuit layers 214, to implement insulated connection between the component 10 and the circuit layer 214 exposed to the third opening 60. The third opening 60 preferably does not expose the circuit layer 214, to prevent the circuit layer 214 exposed to the third opening 60 from being oxidized or corroded.

In some embodiments, the third opening 60 further penetrates the medium layer 212. A penetration depth of the third opening 60 should at least ensure that the circuit board 20 has at least one circuit layer 214 in a projection region corresponding to the third opening 60, that is, at least one circuit layer 214 is not penetrated by the third opening 60.

The inventor of this application has found that after the third opening 60 penetrates all circuit layers 214, wiring of the circuit layer 214 on a side of the circuit board 20 away from the component 10 is affected, and an area of the circuit layer 214 is reduced. In addition, when the circuit layer 214 on the side of the circuit board 20 away from the component 10 needs to be electrically connected to other components (such as a capacitor, an inductor, a chip, and a sensor), these components 10 need to be moved to other positions, resulting in rearrangement of the components 10 in the terminal device 100b, and increasing costs.

It can be understood that, in this embodiment, the component 10 may also include a body 11 and a protrusion 13, and the installation manner may be the same as that in Embodiment 1. Details are not described herein again.

Referring to FIG. 7, the third opening 60 may also be step-like, and the steps of the third opening 60 may be located on the solder mask layer 23 as in Embodiment 1 or Embodiment 2, or may be located on the circuit substrate 21. For example, a second sub-opening 43a penetrates the solder mask layer 23, and a first sub-opening 41a penetrates the solder mask layer 23, part of the medium layers 212, and part of the circuit layers 214. In other embodiments, the step-like structure may be arranged based on an outline of the component 10.

Embodiment 4

Figure 8:
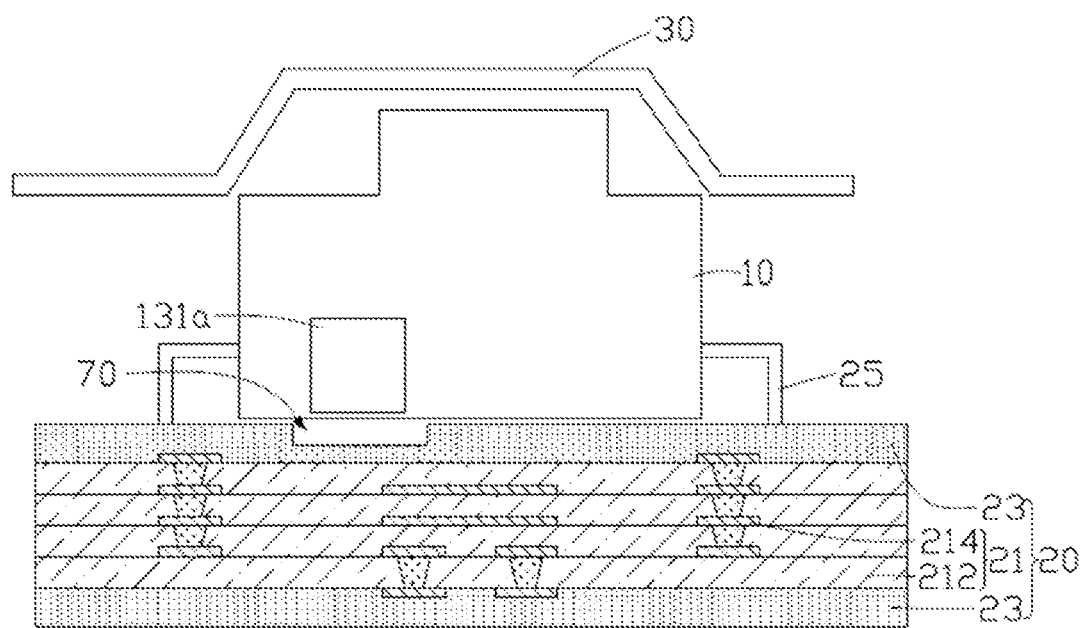
FIG. 8 is a schematic diagram of partial structure of a terminal device which has a fourth opening on a circuit board according to Embodiment 4 of this application.

Referring to FIG. 8, Embodiment 4 of this application provides a terminal device 100c, including a component 10 and a circuit board 20. Types of the component 10 and the circuit board 20 in Embodiment 4 are roughly the same as those in Embodiment 1. The main differences are: a fourth opening 70 is provided in the circuit board 20, the fourth opening 70 is recessed inward on a surface facing the component 10, and at least part of the component 10 is arranged corresponding to the fourth opening 70.

The component 10 includes a sub-component 131a in a region corresponding to the fourth opening 70, and the sub-component 131a is a component sensitive to external force, such as a hall device. The region with the sub-component 131a is arranged corresponding to the fourth opening 70, which can make up for at least part of a to-be-reserved safe distance between the component 10 and the circuit board 20, so as to lower an installation height between the component 10 and the circuit board 20.

A depth of the fourth opening 70 may be provided into part of a solder mask layer 23 as in Embodiment 1; may penetrate the solder mask layer 23 without going into a circuit substrate 21 as in Embodiment 2; or may penetrate the solder mask layer 23 and part of the circuit substrate 21 as in Embodiment 3. For a specific arrangement method, refer to Embodiment 1, Embodiment 2, and Embodiment 3. Details are not described herein again.

In the foregoing design, an opening (such as the first opening, the second opening, the third opening, or the fourth opening) is provided in the circuit board, and part of the component is accommodated in the opening, which not only has no influence on performance of the component and the circuit board, but also lowers the installation height between the component and the circuit board. Alternatively, when a sufficient safe distance needs to be reserved between a partial region of the component and the circuit board, the opening is provided corresponding to the partial region, to make up for the safe distance, which can lower the installation height between the component and the circuit board without affecting the performance of the component and the circuit board.

The foregoing embodiments are merely intended to describe the technical solutions of this application, but not intended to constitute any limitation. Although this application is described in detail with reference to the foregoing preferred embodiments, persons of ordinary skill in the art should understand that modifications or equivalent replacements can be made to the technical solutions of this application, without departing from the spirit and scope of the technical solutions of this application.

What is claimed is:

1. A terminal device, comprising:
    a decorative part;
    a lens module; and
    a circuit board;
    wherein the decorative part is located on a side of the lens module that faces away from the circuit board;
    the lens module is connected to the circuit board;
    wherein the circuit board comprises a circuit substrate and a solder mask layer, and the solder mask layer is located on a surface of the circuit substrate; and
    wherein the circuit board comprises an opening, the opening penetrates through the solder mask layer, at least part of the lens module is accommodated in the opening, and wherein the part of the lens module accommodated in the opening is electrically insulated from a surface of the circuit board.

2. The terminal device according to claim 1, wherein the decorative part covers the lens module.

3. The terminal device according to claim 2, wherein the decorative part comprises a convex portion.

4. The terminal device according to claim 1, wherein a bottom surface of the lens module that is accommodated in the opening is electrically insulated from the surface of the circuit board.

5. The terminal device according to claim 1, wherein the lens module is insulated from a surface of the lens module that faces the circuit board.

6. The terminal device according to claim 1, wherein at least part of the surface of the circuit substrate exposed in the opening is a circuit layer, the circuit layer is configured for routing electrical connections in the circuit board, and the part of the lens module accommodated in the opening is electrically insulated from a surface of the circuit layer.

7. The terminal device according to claim 6, wherein a surface of the lens module that faces the circuit board comprises an insulating material.

8. The terminal device according to claim 6, wherein the terminal device further comprises a connecting member, and the connecting member is connected to a surface of the lens module that does not face the circuit board.

9. The terminal device according to claim 1, wherein another part of the lens module protrudes from the circuit board.

10. The terminal device according to claim 1, wherein the solder mask layer is an oil layer.

11. The terminal device according to claim 1, wherein the circuit substrate comprises a medium layer and a circuit layer stacked with the medium layer.

12. The terminal device according to claim 1, wherein the circuit substrate is a multi-layer circuit substrate.

13. A terminal device, comprising:
    a decorative part;
    a lens module; and
    a circuit board;
    wherein the decorative part is located on a side of the lens module that faces away from the circuit board and the decorative part covers the lens module;
    wherein the lens module is connected to the circuit board;
    wherein the circuit board comprises a circuit substrate and a solder mask layer, the solder mask layer is located on a surface of the circuit substrate, and wherein the circuit substrate comprises a medium layer and a circuit layer stacked with the medium layer; and
    wherein the circuit board comprises an opening, the opening penetrates through the solder mask layer, at least part of the lens module is accommodated in the opening, and wherein the part of the lens module accommodated in the opening is electrically insulated from the surface of the circuit board.

14. The terminal device according to claim 13, wherein the decorative part comprises a convex portion.

15. The terminal device according to claim 13, wherein a bottom surface of the lens module that is accommodated in the opening is electrically insulated from the surface of the circuit board.

16. The terminal device according to claim 13, wherein the lens module is insulated from a surface of the lens module that faces the circuit board.

17. The terminal device according to claim 13, wherein the surface of the circuit substrate exposed in the opening is a circuit layer, and the part of the lens module accommodated in the opening is electrically insulated from the surface of the circuit layer.

18. The terminal device according to claim 17, wherein a surface of the lens module comprises an insulating material.

19. The terminal device according to claim 13, further comprising a connecting member, and the connecting member is connected to a surface of the lens module that does not face the circuit board.

20. The terminal device according to claim 13, wherein another part of the lens module protrudes from the circuit board.

* * * * *